United States Patent
Blake et al.

(10) Patent No.: US 7,493,052 B2
(45) Date of Patent: Feb. 17, 2009

(54) WIDE DYNAMIC RANGE SENSOR SIGNAL PROCESSING METHOD & CIRCUITRY FOR ANALOG AND DIGITAL INFORMATION SIGNALS

(75) Inventors: James N. Blake, Paradise Valley, AZ (US); Farnoosh Rahmatian, Vancouver (CA)

(73) Assignee: NxtPhase T&D Corporation, Vancouver (CA)

( * ) Notice: Subject to any disclaimer, the term of this patent is extended or adjusted under 35 U.S.C. 154(b) by 0 days.

(21) Appl. No.: 11/820,428

(22) Filed: Jun. 19, 2007

(65) Prior Publication Data

US 2007/0253719 A1    Nov. 1, 2007

Related U.S. Application Data

(63) Continuation of application No. 10/354,798, filed on Jan. 29, 2003, now Pat. No. 7,233,746.

(60) Provisional application No. 60/352,890, filed on Jan. 30, 2002.

(51) Int. Cl.
*H04B 10/06* (2006.01)
(52) U.S. Cl. ....................... 398/208; 398/106
(58) Field of Classification Search ................ 398/106, 398/111, 131, 211, 208
See application file for complete search history.

(56) References Cited

U.S. PATENT DOCUMENTS

| | | | | |
|---|---|---|---|---|
| 4,517,586 A | * | 5/1985 | Balaban et al. | ............. 348/572 |
| 4,524,447 A | * | 6/1985 | Willis et al. | .................. 375/243 |
| 5,479,168 A | * | 12/1995 | Johnson et al. | ............. 341/110 |
| 5,644,397 A | | 7/1997 | Blake | |
| 5,696,858 A | | 12/1997 | Blake | |
| 5,987,195 A | | 11/1999 | Blake | |
| 6,016,113 A | * | 1/2000 | Binder | ........................ 341/131 |
| 6,023,331 A | | 2/2000 | Blake et al. | |
| 6,122,415 A | | 9/2000 | Blake | |
| 6,222,861 B1 | | 4/2001 | Kuo et al. | |
| 6,222,881 B1 | * | 4/2001 | Walker | .................. 375/240.03 |
| 6,469,792 B1 | | 10/2002 | Arnn | |

FOREIGN PATENT DOCUMENTS

WO    WO 01/65209 A2    9/2003

OTHER PUBLICATIONS

International Search Report for PCT/US03/02821 (7 pages).

* cited by examiner

*Primary Examiner*—Leslie Pascal
(74) *Attorney, Agent, or Firm*—Potomac Patent Group PLLC (57) ABSTRACT

A sensor provides an analog sensor output signal that is first converted by a A/D converter, followed by a digital signal processor having a digital signal output that is converted to an analog signal by way of a D/A converter so as to provide an analog information output signal indicative of a parameter quantity intended to be sensed. An analog dither signal and/or a digital dither signal is provided for modulating the A/D converter input signal and/or D/A converter input signal, respectively, separately, or in combination, to enhance dynamic range accuracy of the resultant analog information output signal representative of the quantity of the parameter intended to be sensed.

10 Claims, 7 Drawing Sheets

WIDE DYNAMIC RANGE SENSOR SIGNAL PROCESSING METHOD & CIRCUITRY FOR ANALOG AND DIGITAL INFORMATION SIGNALS

RELATED APPLICATION

This application is a continuation application of U.S. patent application Ser. No. 10/354,798, filed Jan. 29, 2003, now U.S. Pat. No. 7,233,746, which claims the benefit of priority pursuant to 35 USC 119 of provisional patent application Ser. No. 60/352,890 filed Jan. 30, 2002, the disclosure of which application is hereby incorporated in its entirety by reference herein.

FIELD OF THE INVENTION

The present invention relates generally to sensor signal processing methods and circuitry for analog sensors, and more particularly to a sensor signal processing method and circuitry for sensors and metering systems employed in power line current and voltage sensor applications with enhanced accuracy over a wide dynamic range.

BACKGROUND OF THE INVENTION

Optical sensors are commonly employed in a wide variety of applications including among others, inertial navigation sensors systems where an optical sensor is responsive to rotation thereof, and optical current and voltage sensors where the optical sensor is responsive to electric and/or magnetic fields. Each of these optical sensors employs an optical beam or light wave that propagates along a specific optical path. Each of these optical sensors generally includes light detector circuitry and signal processing circuitry for sensing a specific parameter that affects the optical beam along the optical path. More specifically, the propagating light wave is affected by the intended parameter intended to be monitored or sensed, for example rotation of the optical path for inertial sensors, electric fields for voltage sensors, and magnetic or electric fields for current sensors, and the like. The characteristic behavior of the light wave or optical beam, for example velocity, phase, and/or polarization may be affected by the intended parameter to be sensed in accordance with well-known and established physical principles.

Commonly, optical sensor systems of the types described employ a photo-detector for obtaining an indication of the instantaneous intensity of one or more optical beams, either separately or in combination, impinging on the photo-detector. In turn the photo-detector output signal is signal processed by a signal processing circuit for deriving therefrom an indication of the parameter intended to be measured—the parameter affecting the optical beam, e.g., the magnitude of the of the change in velocity, phase, and/or polarization in accordance with well known and established principles. Further, the signal processing circuit may also include one or more outputs that may be utilized as a drive signal for affecting the optical path and thereby be incorporated into a closed-loop feedback signal processing sensor scheme for obtaining the indication of the parameter intended to be measured as is in accordance with well known and established principles.

A relatively new application of optical sensors is high voltage power line monitoring systems. These systems require highly accurate current and voltage sensors in which the sensors are physically immersed in the brutal electrical environment of high voltage power lines where the line voltage is in the order of hundreds of Kilo-volts and power line current may be in the range of 1.0 to 5000.0 amps. The latter wide dynamic current range needed to be measured by current sensors is a severe problem in the power line application.

The wide dynamic range requirement may be understood by considering that power plants coupled to an electrical power line grid may be operative in one scenario providing peak current output during heavy summertime use due to air conditioning equipment, i.e., 5000 amps. In another scenario, the power plant may be in an idling mode where the power plant acts as a small load receiving a small amount of current, or is putting out a small amount of current, say, in the order of 1.0 amp.

This wide dynamic range accuracy requirement has commonly necessitated the use of multiple sets of instrumentation to measure power line currents during the aforesaid scenarios. For example, transformers employed for obtaining current measurements may include multiple taps where each tap may be coupled to two or more metering instrumentation systems or meters.

Optical current sensors, and more particularly fiber optic current sensors, are now employed in power-line applications for measuring wide dynamic range current flowing through the power lines. Principles of these types of optical sensors are taught in U.S. Pat. No. 5,644,397, entitled, "Fiber Optic Interferometric Circuit And Magnetic Field Sensor," issued to James N. Blake. Disclosed therein are both Sagnac interferometric and in-line embodiments for constructing an optical current sensor. Various improvements thereof are also disclosed, among others, in U.S. Pat. Nos. 5,696,858, 5,987,195, 6,023,331, and 6,122,415, all issued to James N. Blake.

Briefly, fiber optic current sensors as disclosed in the aforementioned patents work on the principal that a magnetic field produced by a current to be sensed affects the polarization properties of a sensing fiber in the vicinity of the magnetic field through the Faraday effect. The change in the polarization properties of the sensing fiber can be probed in several different ways. Common ways include injecting linearly polarized light and later analyzing the rotation of its polarization state after exiting the sensing region, or measuring the relative velocities of right and left hand circularly polarized light waves that travel through the sensing region using a Sagnac or in-line interferometer technique. The sensor configuration includes an optical exit port for permitting an "affected" optical beam to exit the optical circuit and impinge upon a photo-detector positioned at the terminus of the optical circuit. In all cases, the current to be sensed causes light intensity fluctuations of the exiting optical beam, and in turn causes the photo-detector output signal to exhibit fluctuations related to the light intensity fluctuations thereby providing a signal which may be processed by a signal processing circuit to provide a signal indicative of the current intended to be sensed.

The fluctuations of the light intensity falling on the photo-detector may be processed by analog circuitry to produce an analog output representative of the current being sensed. However, it is often more desirable to digitally process the light intensity fluctuations. Digital processing is often more desirable because: (i) digital output is often more desirable for following subsystems; (ii) more accuracy may be obtained with digital signal processing because the higher processing power available in the digital domain allows for complex characterization, (iii) it is much cheaper to carry out complex signal processing in the digital domain rather than in the analog domain, and (iv) wide dynamic range signals may be more accurately handled in the digital domain.

Generally, the first step required for processing the photo-detector signal in the digital domain is to convert the signal using an A/D converter. After the signal has been processed, it may be converted back to the analog domain using a D/A converter. This conversion back to the analog domain is often required for current and voltage sensors as these sensors may be married to secondary or receiving devices (such as meters, relays, and recorders) which in the power industry often have analog system front-ends.

It should be noted that these secondary devices also have a wide-dynamic range requirement. For example, consider a power meter for measuring the product of sensed current and voltage where the current ranges, as before between 1.0 and 5000.0 amps. Commonly such power meters include analog-to-digital converters and digital signal processing for deriving the desired information, for example watt-hours. As indicated earlier, multiple sets of instrumentation, i.e., multiple meters, may be employed to obtain accurate information depending on the current.

The absolute accuracy of these types of optical sensors as well as the secondary devices, i.e., meters, may be compromised by the A/D and D/A converters employed therewith. This may happen because of the quantization and non-linearities present in the A/D and D/A converters. As an example, consider what happens in an optical current sensor that is made to measure currents as low as ±1 amp, and as high as ±5000 amps. Suppose a 12-bit A/D converter is used to convert the photodetector output signal to a digital signal. These 12 bits (4096 distinct levels) have to describe a 10,000 amp range, or on average, each bit represents about 2.5 amps. Thus the 1 amp signal falls within 1 least significant bit (LSB). Normally, some noise will exist in the detected photo-detector signal that serves to "dither" the detected signal around several LSB's. This noise may be used to overcome the quantization error associated with the signal being comparable to or less than an LSB. However, the overall system accuracy is often not good enough even when the signal with noise spans several LSB's. This is so since the bit spacing for these several LSB's may not be representative of the overall bit spacing for the A/D converter. If these bits are closer together than the overall average bit spacing, then the final output signal will read relatively higher than a large signal which uses many of the bits; and, if these bits are further apart than the average bit spacing, then the final output signal will read relatively lower than a large signal that uses many of the bits.

The same problem as just described for the A/D converter also applies to the D/A converter. Larger converters such as 16-bit or higher A/D or D/A may be used to reduce the magnitude of this problem, but to meet the demanding specifications of wide dynamic range optical sensors with present day (typically 16 bit or less) A/D and D/A converters, there is a need for a signal processing circuit that diminishes the effects of bit non-linearities in these types of optical sensors, including voltage and current sensors, requiring large dynamic range.

SUMMARY OF THE INVENTION

An object of the present invention is to provide a signal processing circuit having wide dynamic range accuracy for optical sensors.

An object of the present invention is to provide a signal processing circuit having wide dynamic range accuracy for power line application secondary devices responsive to power line current measurements.

An object of the present invention is to provide a signal processing circuit for the photo-detector output signal of an optical sensor.

An object of the present invention is to provide a signal processing circuit having wide dynamic range accuracy for analog sensors.

An object of the present invention is to provide a signal processing circuit for a photo-detector output signal of an optical sensor where the photo-detector output signal is converted to a digital signal, processed, and returned to an analog representation of a parameter intended to be sensed by the optical sensor.

In accordance with present invention, a signal processing circuit is provided for an optical sensor having a photo detector output signal. The signal processing circuit is configured to be responsive to the photo-detector output signal where the photo-detector output signal contains information of a parameter quantity intended to be sensed by the optical sensor, for example, optically sensed power line current. The optical sensor provides an analog sensor output signal that is first converted by a A/D converter, followed by a digital signal processor having a digital signal output that is converted to an analog signal by way of a D/A converter so as to provide an analog information output signal indicative of a parameter quantity intended to be sensed. An analog dither signal and/or a digital dither signal is provided for modulating the A/D converter input signal and/or D/A converter input signal, respectively, separately, or in combination, to enhance dynamic range accuracy of the resultant analog information output signal representative of the quantity of the parameter intended to be sensed.

The present invention is particularly directed to optical current and voltage sensors, as well as any optical sensor having a photo-detector output signal intended to be digitally signal processed to provide an output signal representative of the quantity of the parameter intended to be sensed.

The present invention is also directed to any measurement system responsive to a an analog sensor input signal which may be digitally converted for subsequent signal processing to derive selected information or subsequent conversion back to an analog signal to provide an output signal representative of the quantity of the parameter intended to be sensed.

DETAILED DESCRIPTION OF THE INVENTION

Figure 1:
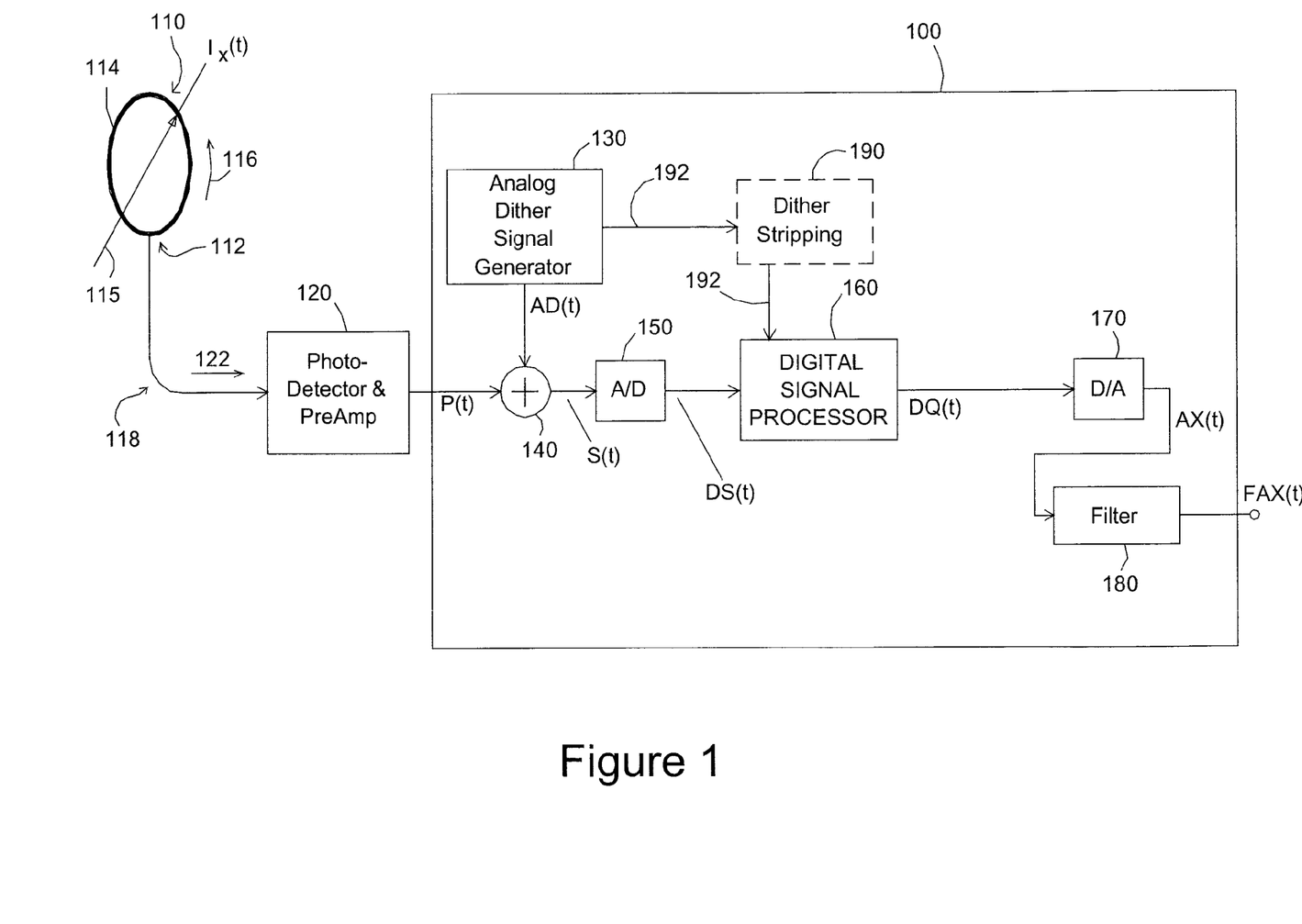
FIG. 1 is a schematic block diagram of the signal processing circuit in accordance with the present invention.

Illustrated in FIG. 1 is a schematic block diagram of a signal processing circuit 100 in accordance with the present invention. By way of example, an optical sensor is depicted in FIG. 1 as an optical current sensor 110 where sensor 110 includes a current sensor head 112 that provides a light propagation path 114 through which a light wave 116 propagates there along. Sensor head 112 is intended to be in proximity to an electrical conductor 115 through which a current $I_x(t)$ flows therethrough and is intended to be measured as described in the aforementioned patents, all of which are incorporated herein by reference thereto, and in accordance well known and established principles.

Associated with the optical sensor 110 is a photo-detector 120 responsive to one or more light waves associated with light wave 116 and contains the necessary information, e.g., velocity, phase, and/or polarization, to provide an indication of the current flowing through conductor 115. Photo-detector 120 is illustrated as being coupled to a optical propagation path 118, e.g., an optical fiber, for directing a light wave 122 associated with light wave 116 so as to impinge upon photo-detector 120. In turn, photo-detector 120 provides an analog output signal P(t) representative of the intensity of the light wave 122 impinging on photo detector 120. Although not shown, photo-detector 120 generally may include low noise amplification or pre-amplification circuitry so as to produce a signal sufficient to be recognized by A/D converter 150 in a manner as will subsequently described.

Signal processing circuit 100 in accordance with the present invention includes an analog dither signal generator 130, analog summing circuit 140, analog-to-digital (A/D) converter 150, digital signal processor 160, digital-to-analog (D/A) converter 170, and output filter circuit 180.

In accordance with the present invention, an "analog signal dither" is utilized to linearize the resultant digital output information from an A/D converter that the A/D converter may inherently corrupt an analog information signal intended to be converted into a digital information signal. Similarly, a "digital signal dither" may be utilized to linearize the resultant analog output information signal from a D/A converter that the D/A converter may inherently corrupt a digital information signal intended to be converted into the analog information signal.

Figure 8:
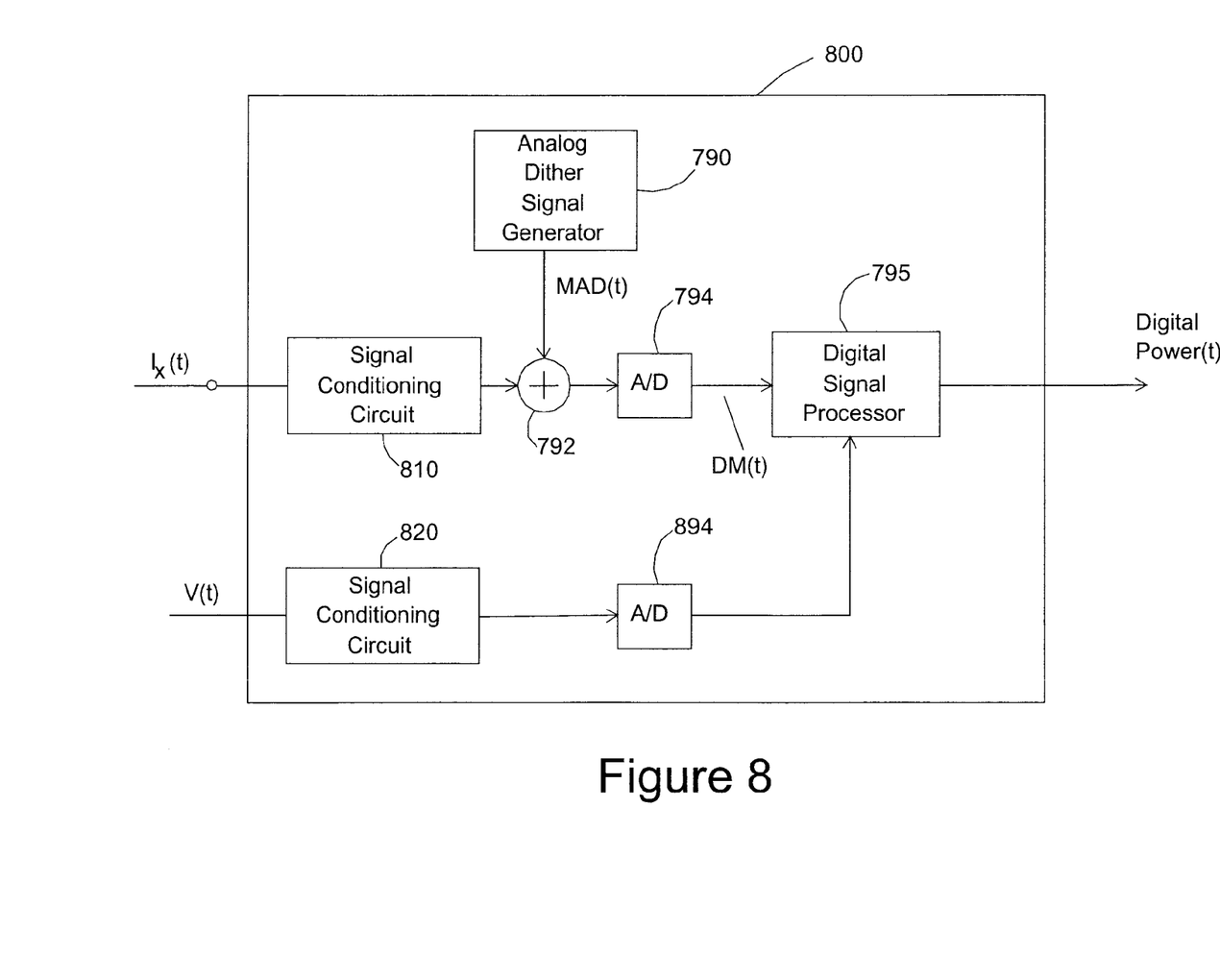
FIG. 8 is a schematic block diagram of another embodiment of a signal processing circuit in accordance with the present invention particularly illustrating a power line metering and monitoring application.

In accordance with the present invention, power line measurement and monitoring equipment, particularly illustrated on FIG. 8, commonly utilize analog output signals from analog current and voltage sensors which need to signal processed, preferably by digital techniques for obtaining selected information. Such power line measurement and monitoring equipment commonly include A/D and D/A converters that may corrupt the corresponding analog input signal information. As indicated earlier, the wide dynamic range requirements may exacerbate the aforesaid corruption yielding diminished accuracy. Further, as indicated in FIG. 1, such converters are commonly employed with particular use of current sensors employing optical sensors, as well as other types of sensors, in power line applications as depicted in FIG. 1. Such converters are also employed in other power line application secondary devices and/or instrumentation.

Referring again to FIG. 1, dither signal generator 130 is intended to provide an analog dither signal AD(t) having known characteristics. For example, dither signal generator 130 may provide a time varying analog signal having a known signal waveform, amplitude, and frequency as will be subsequently described with reference to FIGS. 2 and 3. The analog dither signal AD(t) need not be periodic, but preferably has known properties. On the other hand, dither signal generator 130 could take the form of an analog signal noise source having known or detectable properties.

Analog dither signal AD(t) is summed together with the photodetector signal P(t) by way of analog summing circuit 140, and provides an output sum signal S(t) as an input to A/D converter 150. The output of the A/D converter 150, namely DS(t), is provided as the primary input signal to digital signal processor 160 for performing digital signal processing of signal DS(t) as desired. In turn, digital sensor signal processor 160 provides a digital signal output DQ(t) representative of the parameter intended to be sensed by the optical sensor 110 including a dither signal component. Digital signal output DQ(t) is coupled to D/A converter 170 for converting digital signal output DQ(t) into analog output signal AX(t) which, in turn, may be signal filtered by filter circuit 180 for providing a filtered analog output signal FAX(t) representative of $I_x(t)$ where "FAX" nomenclature represents the filtered analog signal AX(t) representative of $I_x(t)$.

It should be noted that digital signal processor 160 may take on many forms to derive an indication of the parameter intended to be sensed, and depends upon the information contained in the intensity variations of the detected light wave by photo-detector 120. Examples of such processing are indicated in the aforementioned patents, albeit in analog form. Further, digital signal processor 160 may be constructed by way of hardware, software and/or firmware for achieving the intended information. An example of digital signal processor 160 may be a "FPGA"—Field Programmable Gate Array well known in the art and particularly depicted in FIG. 6 as will be subsequently described.

Operation of the signal processing circuit 100 in accordance with the present invention will now be described. Analog dither signal AD(t) is combined with photo-detector output signal P(t) to form analog signal S(t) for subsequent presentation as the input to A/D converter 150. Analog signal S(t) is essentially signal P(t) modulated by the dither signal AD(t). In this way, local bit spacing errors of A/D converter 150 are averaged out over a dither signal period of signal AD(t). The waveform of the exemplary analog dither signal AD(t) as illustrated in FIG. 2 may take many forms, including noise, and be effective for the intended purpose of modulating the digital output signal DS(t) of A/D converter 150.

Figure 2:
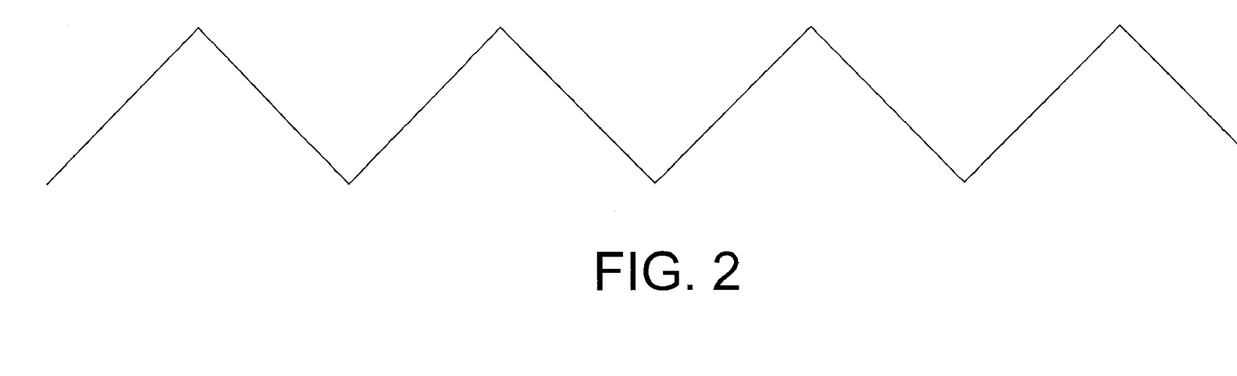
FIG. 2 depicts an analog dither signal in accordance with the present invention.
Figure 3:
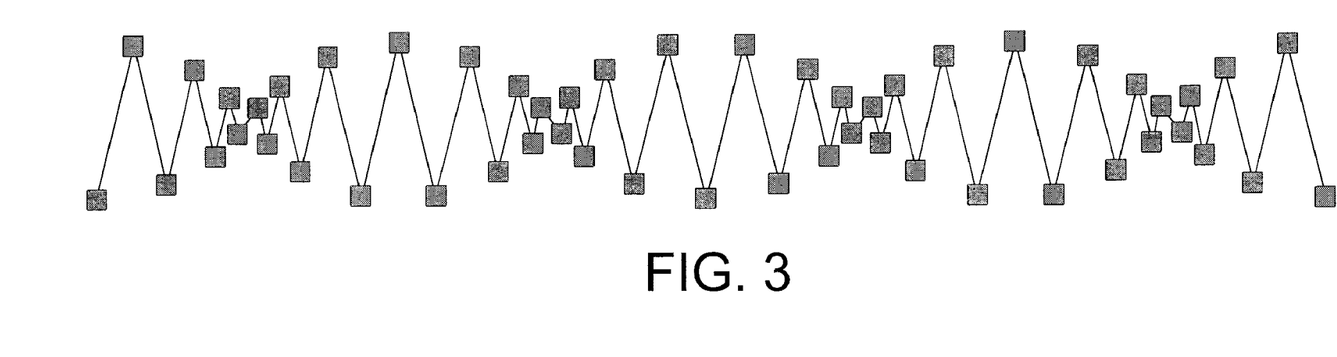
FIG. 3 depicts discrete digital values of a dithered analog sensor output signal.

In an exemplary embodiment of the invention, analog dither signal generator 130 is configured so a to provide a triangle waveform signal AD(t) as particularly illustrated in FIG. 2. In turn, the output of A/D converter 150 may have discrete digital values, as depicted in FIG. 3, for subsequent signal processing by digital signal processor 160. It has been found that the choice of a triangular waveform tends to give equal weighting to all the bits covered by the analog dither signal AD(t). Further, it has been found that it is effective for the amplitude of the analog dither signal AD(t) to be such that it causes a few percent variation of the total bit range of the A/D converter 150 for each cycle thereof. In an exemplary embodiment of the invention, analog dither signal generator 130 is configured so that the peak-to-peak signal of AD(t) is sufficient to dither the A/D converter 150 over 1/16 of the digital range of A/D converter 150 at 2 kHz.

As indicated earlier, the embodiment illustrated in FIG. 1 is such that the analog dither signal AD(t) is interpreted by the digital signal processor 160 as a component of the sensed current $I_x(t)$, but in digital form, and again shows up in the output AX(t) which may be then filtered by filter 180 to remove the analog dither component so to provide signal FAX(t) indicative of the parameter intended to be sensed.

As a further enhancement to the signal processing circuit of FIG. 1, digital signal processor 160 may include an optional digital dither stripper 190 for digitally stripping the digital signal output of A/D converter 150 either prior to digital signal processing by processor 160 or thereafter. Synchronization signal line 192 represents the synchronization between the analog dither signal AD(t) and the digital dither stripper 190. This function, namely digitally stripping the added analog dither signal before the A/D converter 150 may be accomplished by a wide away of techniques well known to those skilled in the art. In some circumstances, it may be desirable to not completely strip the dither signal contained in signal DQ(t) as will subsequently be describe, particularly for subsequent secondary devices responsive to signal FAX(t).

Figure 4:
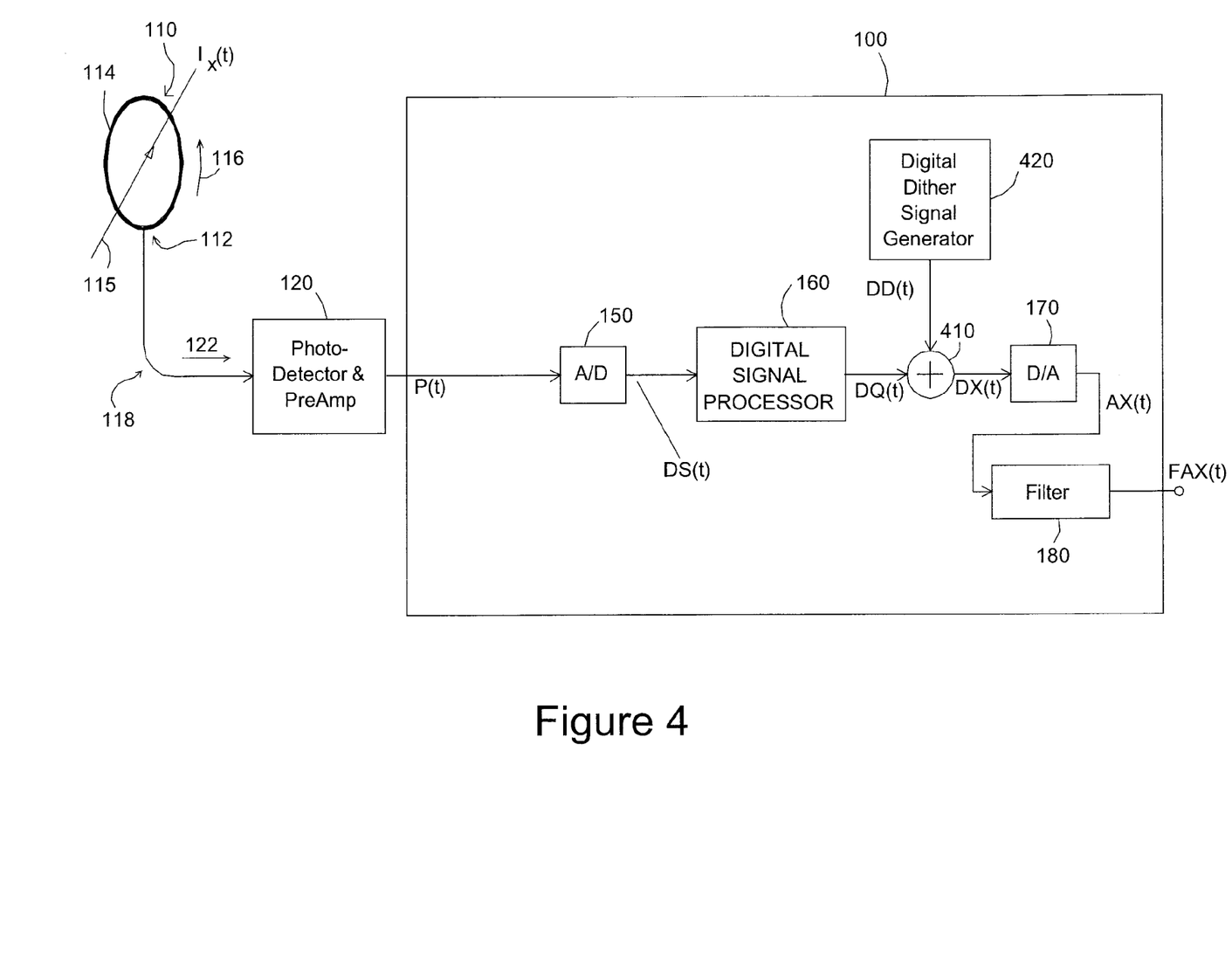
FIG. 4 is a schematic block diagram of another embodiment of a signal processing circuit in accordance with the present invention.

In FIG. 4, thereshown is an alternate arrangement of a signal processing circuit in accordance with the present invention where like components have retained the same numeral designations. The analog dither signal generator 130 and analog summing circuit 140 of FIG. 1 are eliminated in FIG. 4. The photo-detector output signal P(t) is coupled directly into A/D converter 150. As before digital signal processor 160 processes digital signal DS(t) so as to derive a digital sensor signal DQ(t) indicative of the parameter intended to be sensed. Digital signal output DQ(t) of digital signal processor 160 is digitally combined by way of digital summing block 410 with a digital dither signal DD(t) provided by digital dither signal generator 420, and provides a digital sum signal DX(t). In turn, the digital output signal DX(t) is converted to an analog signal AX(t) which is filtered by analog filter 180 to remove the digital dither signal DD(t) provided by way of digital dither generator 420, and provide analog output signal FAX(t) representative of the parameter intended to be sensed.

Digital dither signal DD(t) serves to average bit usage in the output D/A converter 170 to produce analog signal AX(t). Since this digitally induced dither signal DD(t) appears in the output signal AX(t) of D/A converter 170, signal AX(t) is desirably filtered if it is unacceptable for it to be present. The digital dither signal frequency is preferably very much higher than the signal frequency bandwidth of the input current $I_x(t)$ so that it may be effectively filtered out by filter 180 in the form of a simple low-pass filter.

Figure 5:
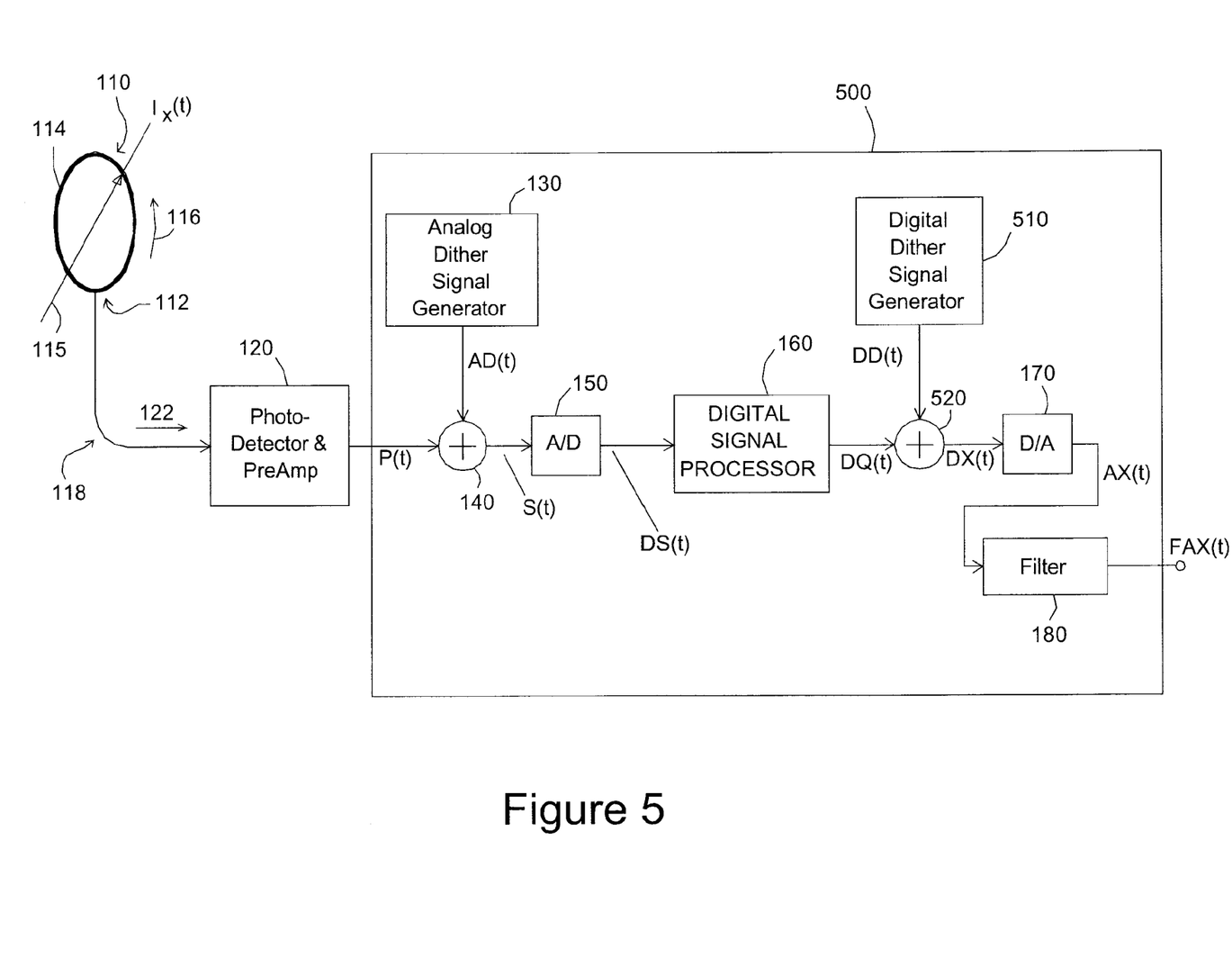
FIG. 5 is a schematic block diagram of another embodiment of a signal processing circuit in accordance with the present invention.

In FIG. 5, thereshown is an arrangement of a signal processing circuit 500 that employs novels aspects of the present invention as already described with reference to FIGS. 1 and 4. In FIG. 5, like components of those described with reference to FIGS. 1 and 4 have retained the same numeral designations. In the arrangement of signal processing circuit 500 illustrated in FIG. 5, (i) the photo-detector output P(t) is dithered by the analog dither signal AD(t) prior to being digitized by A/D converter 150 (like FIG. 1); and (ii) the output DQ(t) of digital signal processor 160 is digitally dithered by digital dither signal DD(t) prior to being converted to an analog signal AX(t) by A/D converter 170 (like FIG. 4) followed by and filtered by filter 180 to produce signal FAX (t).

As before with reference to FIG. 1, the analog dither signal may be stripped away before or after digital signal processing as taught with reference to blocks 190 and signal 192 (not shown in FIG. 5). The signal processing circuit of FIG. 5 takes advantage of analog dither signal AD(t) to enhance the accuracy of the signal from the A/D converter 150, and takes advantage of the digital dither signal DD(t) to enhance the accuracy of the signal from the D/A converter 170. Filter 180 may be constructed, as indicated earlier to filter out, at least in part, either or both the analog dither signal AD(t) as well as the digital dither signal DD(t).

Figure 6:
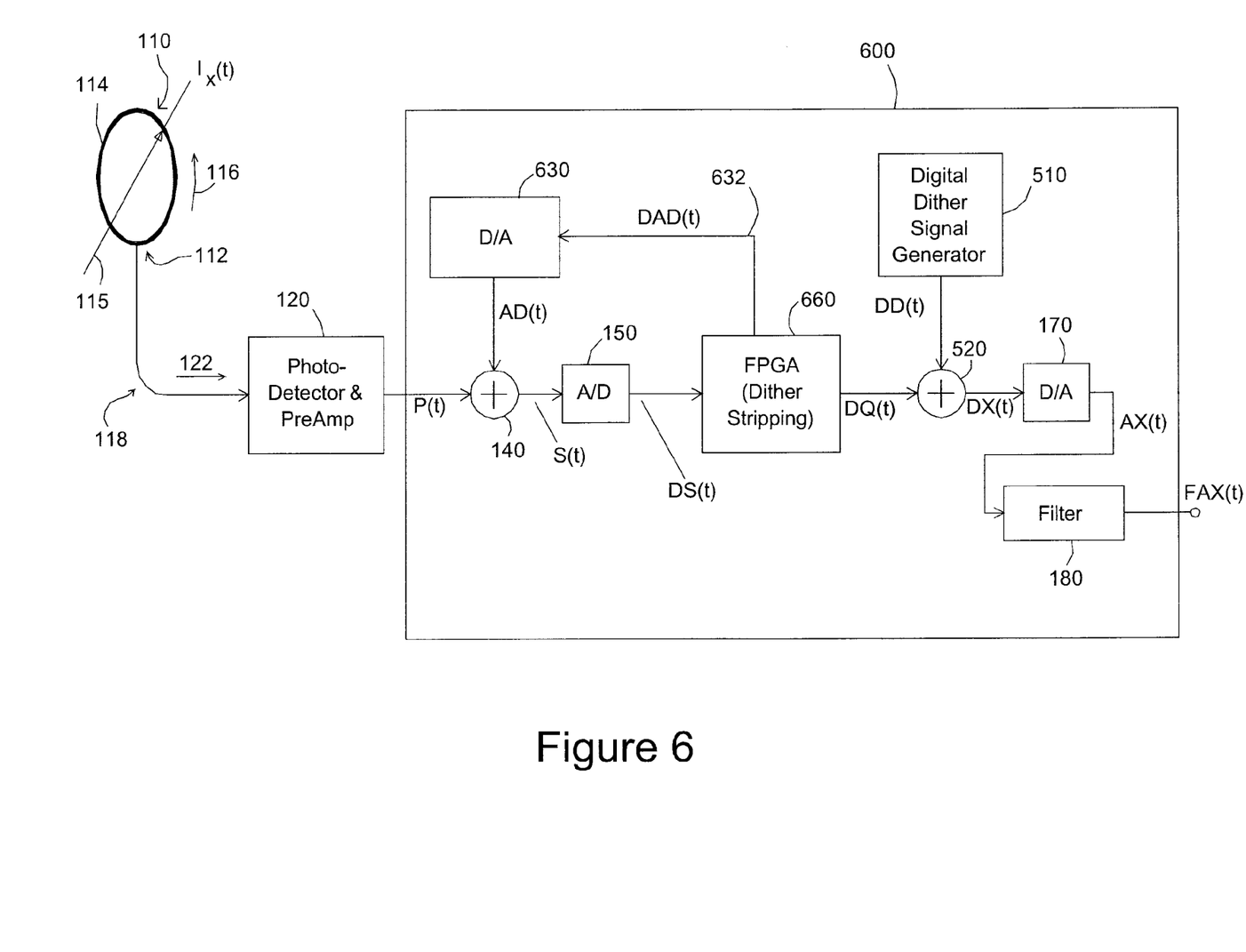
FIG. 6 is a schematic block diagram of another embodiment of a signal processing circuit in accordance with the present invention employing a field programmable gate array.

In FIG. 6, thereshown is an arrangement of a signal processing circuit 600 that employs novels aspects of the present invention as already described with reference to FIGS. 1, 4 and 5. In FIG. 6, like components of those described with reference to FIGS. 1, 4 and 5 have retained the same numeral designations. In the arrangement of signal processing circuit 600 illustrated in FIG. 6, (i) digital signal processor 160 is depicted as a field programmable gate array (FPGA) indicated by numeral designation 660; and (ii) the analog dither signal generator 130 is replaced with a D/A converter 630 responsive to the digital signal DAD(t) provided as an output from FPGA 660 on signal line 632. In accordance with the circuit construction as depicted in FIG. 6, the FPGA may easily provide digital dither stripping of signal DS(t) internal to the FPGA without any additional circuitry. Although not shown, a digital dither signal DD(t) may likewise be provided as an output of the FPGA with selected characteristics being the same or different than that of signal DAD(t).

Figure 7:
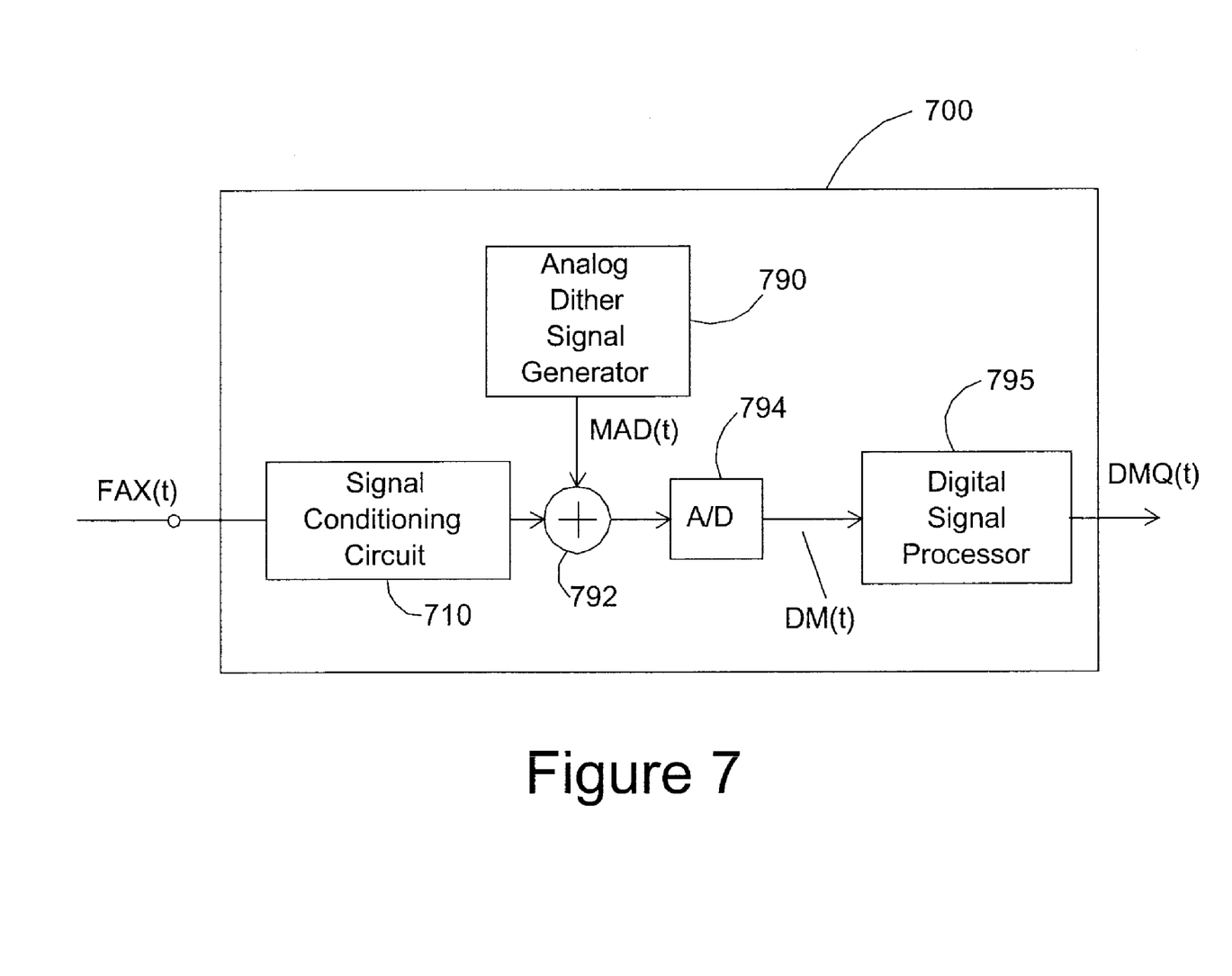
FIG. 7 is a schematic block diagram of another embodiment of a signal processing circuit in accordance with the present invention.

Illustrated in FIG. 7 is another aspect of the present invention depicting a secondary device as earlier described for power line applications or the like. Thereshown is a secondary device 700 including an analog dither signal generator 790, signal conditioning circuit 710, analog summing circuit 792, A/D converter 794, and digital signal processor 795 providing an output signal DMQ(t). The construction and operation of device 700 is similar to that already described with reference to FIG. 1. Signal conditioning circuit 710 may optionally be desired to provide filters, transformers, and pre-amplifiers, as desired.

As is well known in the art of power line measuring and monitoring equipment, a signal representative of the power line current indicated by signal FAX(t), that may be determined by current sensor systems other than optical sensors, is illustrated as an input to secondary device 700. Secondary device may be a meter or recording device as desired, generally including circuits and systems that require conversion of the sensed current signal into digital form for subsequent processing. Accordingly, an A/D converter 794 is employed to convert the analog signal into a digital signal for subsequent signal processing, recording, monitoring, and/or the like. As described earlier, device 700 needs to have wide dynamic range enhanced accuracy. Commonly, such wide dynamic range enhanced accuracy for secondary power line application devices is obtained, as indicated earlier, by way of multiple sets of instrumentation to achieve the intended accuracy.

In accordance with the present invention, secondary devices for power line monitoring and measuring devices may be achieved by way of applying analog dither MAD(t) to the analog input signal FAX(t) by way of analog dither signal generator 790 and summing circuit 792 before being coupled to A/D converter 794 in a manner as already described. In turn, as before, the output DM(t) of the A/D converter 794 is digitally processed by digital signal processor 795 so as to obtain the intended digital signal output DMQ(t). Although not shown, the embodiment of FIG. 7 may also include filtering and dither signal stripping as desired and previously described.

FIG. 8 illustrates a simple power meter 800 as an example of one such secondary device for power line applications. Like components of FIG. 7 have retained the same numeral designation in FIG. 8. As is customary, device 800 utilizes an analog signal representative of current $I_x(t)$, and an analog signal representative of voltage $V_x(t)$. Like FIG. 7, signals $I_x(t)$ and $V_x(t)$ may be operated on by optional signal conditioning circuitry as indicated by blocks 810 and 820, respectively. The voltage signal $V_x(t)$ is converted to a digital voltage signal by way of A/D converter 894, and the current signal $I_x(t)$, along with the analog dither signal MAD(t), is converted to a digital signal by way of A/D converter 794. In turn, digital signal processor 795, responsive to the outputs of A/D converters 794 and 894 may be employed to arrive at a variety of digitally processed data, for example power, i.e., the product of voltage times the current. Further, processor 795 may provide other information such as time associated data as well as watt-hour information, and the like.

It should be noted that application of the dither signal technique achieves the desired wide dynamic range without the need for multiple sets of instrumentation. In such a metering application as illustrated in FIG. 8, the voltage sensor signal does not need wide dynamic range since it is most likely a predictable value over a narrow range of values. In contrast, the current sensor signal needs highly accurate wide dynamic range since it may make take on values from low—several amps, to high—several thousand amps.

As set forth in the accompany description of the invention, a method has been taught to achieve wide dynamic range of current sensors and secondary devices, such as meters for power line applications. Specifically, analog sensor signals are combined with an analog dither signal before being analog-to-digitally converted for subsequent digital signal processing. Similarly, digital output signals may be combined with a digital dither signal before being digital-to-analog signal converted for subsequent use by analog secondary signal processing, for example metering equipment.

Although the present invention had been particularly described with employment of optical sensors, any analog sensor that is intended to be digitally converted is within the true spirit and scope of the present invention.

Further, it should be recognized that although circuit components have been indicated in the drawings by way of separate blocks performing separate functions in order to enhance understanding of the invention, such functions may be more or less incorporated into other components serving the intended functions. For example, the digital signal generator and digital summing components may be incorporated into a multi-function digital signal processor which may be constructed by way of hardware, firmware, software, and the like as is well known to those skilled in the art in order to achieve the intended functions as set forth in the accompanying claims.

While the present invention has been particularly shown and described with reference to the accompanying figures, it will be understood, however, that other modifications thereto are of course possible, all of which are intended to be within the true spirit and scope of the present invention. Various changes in form and detail may be made therein without departing from the true spirit and scope of the invention as defined by the appended claims.

We claim:

1. A signal processing circuit for an optical sensor having a photo-detector output signal wherein the photo-detector output signal contains information of a parameter quantity intended to be sensed by the optical sensor, the signal processing circuit comprising:
  an analog signal generator for providing an analog dither signal having a selected amplitude, frequency, and waveform;
  a signal summing means for summing said photo-detector output signal and said analog dither signal and providing an analog sum signal representative of the sum of said analog dither signal and said photo-detector output signal;
  an analog-to-digital converter configured to receive said analog sum signal for providing a digital sum signal representative of said analog sum signal wherein said analog-to-digital converter has a known number of bits forming said digital sum signal; and
  a digital signal processor responsive to said digital sum signal for deriving a digital sensor signal representative of said parameter quantity.

2. The signal processing circuit of claim 1 wherein said digital signal processor further includes means for digitally subtracting said analog dither signal such that said digital sensor signal is substantially devoid of any dither signal component.

3. The signal processing circuit of claim 1 further comprising a digital-to-analog converter for converting said digital sensor signal to an analog sensor output signal.

4. The apparatus of claim 3 further comprising an analog filter means for filtering said analog sensor output signal and providing a third analog sensor signal indicative of the parameter quantity intended to be sensed by said optical sensor.

5. A signal processing circuit for an analog sensor output signal containing information of a parameter quantity intended to be sensed, the signal processing circuit comprising:
  an analog signal generator for providing an analog dither signal;
  a signal summing means for summing said analog sensor output signal and said analog dither signal and providing an analog sum signal representative of the sum of said analog dither signal and said analog sensor output signal;
  an analog-to-digital converter configured to receive said analog sum signal for providing a digital sum signal representative of said analog sum signal wherein said analog-to-digital converter has a known number of bits forming said digital sum signal; and
  a digital signal processor responsive to said digital sum signal for deriving a digital sensor signal containing information related to said parameter quantity.

6. A signal processing circuit for a sensor producing an analog sensor output signal containing information of a parameter quantity intended to be sensed, the signal processing circuit comprising:
  an analog-to-digital converter responsive to an analog input signal derived from said analog sensor output signal for providing a digital sensor signal representative of said analog sensor output signal;
  a digital signal processor responsive to said digital sensor signal for deriving a digital information signal containing information related to said parameter quantity;
  a digital signal generator for providing a digital dither signal;
  a digital signal summing means for summing said digital dither signal and said digital information signal, and providing a digital sum signal representative of the sum of said digital dither signal and said digital information signal;
  a digital-to-analog converter configured to receive said digital sum signal for providing an analog information signal representative of said digital sum signal wherein said digital-to-analog converter has a known number of input bits forming said analog information signals;

an analog signal generator for providing an analog dither signal having a selected amplitude, frequency, and waveform; and a signal summing means for summing said sensor output signal with said analog dither signal, and providing said analog input signal representative of the sum thereof.

7. The signal processing circuit of claim 6 wherein said signal processor includes a field programmable array.

8. The signal processing circuit of claim 6 wherein:

said signal processor includes a field programmable array, including a secondary digital dither signal; and said analog dither signal generator is a digital analog converter for converting said secondary digital dither signal to said analog dither signal.

9. A signal processing circuit for an analog sensor output signal containing information of a parameter quantity intended to be sensed, the signal processing circuit comprising:

an analog-to-digital converter responsive to an analog input signal including at least a component of said analog sensor output signal, and for providing a digital information signal representative of said analog input signal;

a digital signal processor responsive to said digital information signal for deriving a digital sensor signal containing information related to said parameter quantity;

a digital-to-analog converter configured to receive said digital sensor signal for providing an analog information signal representative of said digital sensor signal; and at least a selected one of, an analog signal generator for providing an analog dither signal for dithering said analog input signal provided as said input to said analog-to-digital converter and a first signal summing means for summing said analog input signal within said analog dither signal to generate an analog sum and for providing said analog sum to said analog-to-digital converter, and a digital dither signal generator for digitally dithering said digital sensor signal provided as said input to said digital-to-analog converter and a second signal summing means for summing an output of said digital dither signal generator and an output of said digital signal processor to generate a digital sum and for providing said digital sum to said digital-to-analog converter.

10. A method of signal processing an analog sensor output signal containing information of a parameter quantity intended to be sensed, the method comprising the steps of:

selectively summing said analog sensor output signal with an analog dither signal using an analog summer and providing an analog sum signal indicative of the sum thereof;

converting said analog sum signal to a digital sum signal using an analog-to-digital converter;

signal processing said digital sum and deriving a digital sensor signal containing information related to said parameter quantity using a signal processor;

selectively summing said digital sensor signal with a digital dither signal using a digital summer and providing a digital sum signal indicative of the sum thereof;

converting said digital sum signal to an analog information signal representative of said digital sum signal using a digital-to-analog converter; and selectively filtering said analog information signal to selectively remove said analog dither signal and said digital dither signal as desired using a filter, so as to provide an enhanced accuracy analog information signal over a wide dynamic range.

* * * * *